(12) United States Patent
Jung et al.

(10) Patent No.: US 9,009,418 B2
(45) Date of Patent: Apr. 14, 2015

(54) MULTIMEDIA PLATFORM

(75) Inventors: You-Hoan Jung, Seoul (KR); Jong-Sik Jeong, Seoul (KR)

(73) Assignee: Mtekvision Co., Ltd., Seoul (KR)

( * ) Notice: Subject to any disclaimer, the term of this patent is extended or adjusted under 35 U.S.C. 154(b) by 437 days.

(21) Appl. No.: 13/184,219

(22) Filed: Jul. 15, 2011

(65) Prior Publication Data

US 2011/0271081 A1 Nov. 3, 2011

Related U.S. Application Data

(62) Division of application No. 12/066,747, filed as application No. PCT/KR2006/003495 on Sep. 4, 2006, now Pat. No. 8,185,702.

(30) Foreign Application Priority Data

Sep. 15, 2005 (KR) .......................... 10-2005-0086229

(51) Int. Cl.
*G06F 12/00* (2006.01)
*G06F 15/16* (2006.01)

(52) U.S. Cl.
CPC ....................... *G06F 15/16* (2013.01)

(58) Field of Classification Search
USPC ......................................................... 711/147
See application file for complete search history.

(56) References Cited

U.S. PATENT DOCUMENTS

| 7,034,387 B2* | 4/2006 | Karnezos ..................... 257/686 |
| 7,306,973 B2* | 12/2007 | Karnezos ..................... 438/109 |
| 2006/0095622 A1 | 5/2006 | Rosner et al. |

OTHER PUBLICATIONS

Broadcam Corporation, "BCM2722, Product Brief" Apr. 4, 2005.
Samsung Electronics, "SC32442A 32-bit RISC Application processor", Revision 1.1, User's Manual, http://www.samsung.com/Products/Semiconductor/MobileSoC/ApplicationProcessor/ARM9Series/SC32442/SC, Mar. 2005.
STMicroelectronics, "STn8810/STn8811/STn8812(Trio of Nomadik application processors bring multimedia to next generation mobile devices", http://www.st.com/stonline/products/literature/bd/11196/stn8810.pdf, Feb. 2005. See Features (p. 1) and Stacked memory option (p. 5).

* cited by examiner

*Primary Examiner* — Matthew Bradley
(74) *Attorney, Agent, or Firm* — Birch, Stewart, Kolasch & Birch, LLP

(57) ABSTRACT

A multimedia platform is discussed, which includes a first stacking unit including a first substrate and a multimedia processor, wherein the first substrate and the multimedia processor are stacked on the first stacking unit, a pattern and a via hole are formed on the first substrate, and the multimedia processor is mounted on top of the first substrate; a second stacking unit including a second substrate and a plurality of storage devices, wherein the second substrate and the plurality of storage devices are stacked on the second stacking unit, a pattern and a via hole being formed on the second substrate, and the plurality of storage devices are mounted on top of the second substrate; and at least one solder ball arranged on the first stacking unit, the at least one solder ball allowing the first substrate to be coupled to the second substrate.

4 Claims, 3 Drawing Sheets

MULTIMEDIA PLATFORM

CROSS REFERENCE TO RELATED APPLICATIONS

This application is a Divisional of co-pending Application Ser. No. 12/066,747 filed on Mar. 13, 2008, which is a U.S. National Phase of PCT International Application No. PCT/KR2006/003495 filed on Sep. 4, 2006, which claims the benefit of priority from Korean Patent Application No. 10-2005-0086229 filed on Sep. 15, 2005. The entire contents of all of the above applications are hereby incorporated by reference.

TECHNICAL FIELD

The present invention is related to sharing of a memory (storage device), particularly to a method and a device thereof for having a memory shared by a plurality of processors in an electrical/electronic device (digital processing device).

BACKGROUND ART

As an example of electrical/electronic devices, portable terminals refer to electronic devices that can be easily carried by making the size compact in order to perform functions such as game and mobile communication. Portable terminals can include, for example, mobile communication terminals, personal digital assistants (PDA) and portable multimedia players (PMP).

Among the portable terminals, the mobile communication terminal is essentially a device designed to enable a mobile user to telecommunicate with a receiver who is remotely located. Thanks to scientific development, however, the latest mobile communication terminals have functions, such as camera and multimedia data playback, in addition to the basic functions, such as voice communication, short message service and address book.

Portable terminals comprise a plurality of processors, including a main processor and at least one application processor, to perform multiple functions. The main processor controls the functions of the portable terminal and the operations of each application processor. The application processor performs predetermined additional functions (e.g. camera and multimedia data playback). In addition, portable terminals further comprise one or more memories to be connected to each processor.

The memories linked to the main processor include a NAND flash memory and a buffer memory. The NAND flash memory and buffer memory are integrated to one chip through the multi-chip package technology.

Below is a brief description with reference to FIG. 1 of connection structure and operation of processors in accordance with the prior art.

FIG. 1 is a diagram showing the connection structure between processors of the prior art. Although one application processor (a multimedia processor for processing multimedia data) is shown in FIG. 1, the number of application processors can vary as necessary.

Referring to FIG. 1, a portable terminal 100 of the prior art comprises a main processor 110, a memory chip 115, a multimedia platform 120, a sound output unit 125, an image sensor 130 and a display unit 135. The main processor 110, memory chip 115 and multimedia platform 120 can be realized in one chip, respectively.

The main processor 110 comprises a boot sequencer 140, a NAND interface 142, a cache memory 146, a processor core 148, an SD interface 150 (or a buffer interface) and a host interface 152.

To have the processor core 148 perform the booting, the boot sequencer 140 accesses a NAND flash memory 162 through the NAND interface 142 to read boot data and then delivers the read boot data to the processor core 148.

The processor core 148 performs a logic and/or operation pre-designated to function as the main processor 110. The process core 148 can comprise the cache memory 146 as a memory for performing the pre-designated logic or operation. Hereinafter, the processor core 148 included in the main processor 110 will be called the "main processor core."

The NAND interface 142 interfaces with the NAND flash memory 162 included in the memory chip 115, and the SD interface 150 interfaces with a buffer memory 164 included in the memory chip 115. The host interface 152 interfaces with the multimedia platform 120.

The memory chip 115 comprises the NAND flash memory 162 and the buffer memory 164 in one chip through the multi-chip package technology.

The multimedia platform 120 comprises a multimedia processor 170 and a buffer memory 178 in one chip.

The multimedia processor 170 comprises a host interface 172 interfacing with the main processor 110, a processor core 174 performing a logic and/or operation pre-designated to function as the multimedia processor 170 and an SD interface 176 (or a buffer interface) interfacing with the buffer memory 178. Hereinafter, the processor core 174 included in the multimedia processor 170 will be called the "multimedia processor core."

Coupled to the back of the multimedia platform 120 are the sound output unit 125, the image sensor 130 and the display unit 135.

The connection structure between processors shown in FIG. 1 is based on the related art and is familiar with anyone of ordinary skill in the art to which the invention pertains. Thus, further description will be omitted here.

Hereinafter, with reference to the connection structure of processors shown in FIG. 1, the booting sequence of the main processor 110 and the multimedia processor 120 will be briefly described.

The booting sequence of the main processor 110 is as follows:

Once the portable terminal 100 is powered on, the boot sequencer 140 accesses the NAND flash memory 162 in the memory chip 115 through the NAND interface 142.

The boot sequencer 140 reads boot data stored in an area of the NAND flash memory 162 and writes the boot data in the cache memory 146.

The boot sequencer 140 then delivers the boot data, stored in the cache memory 146, to the main processor core 148. Or, the processor core 148 can also read the boot data stored in the cache memory 146.

After booting through the use of the delivered boot data, the main processor core 148 reads the data for operating the portable terminal 100 that are stored in the NAND flash memory 162 through the NAND interface 142 and stores the data in the buffer memory 164 in the memory chip 115 accessed through the SD interface 150. The operating data stored in the NAND flash memory 162 is stored in the buffer memory 164 because the operating speed of the NAND flash memory 162 is slow.

Next, the booting sequence of the multimedia processor 170 is as follows:

The main processor core 148 reads the boot data stored in the NAND flash memory 162 in the memory chip 115 in order to have the multimedia processor core 174 perform the booting. If the main processor core 148 has already read the data and stored the data in the buffer memory 164, the data can be also read from the buffer memory 164.

The main processor core 148 delivers the read boot data to the multimedia processor core 174 through the host interface 152 and 172. The main processor core 148 can deliver the boot data, with a boot command, to the multimedia processor core 174.

After storing the received boot data in the buffer memory 178 through the SD interface 176, the multimedia processor core 174 performs the booting by use of the stored boot data.

As described above, to control the booting of the multimedia processor 170, the main processor 110 reads the needed data from the NAND flash memory 162 (or from the buffer memory 164) in the connected memory chip 115 and delivers the data to the multimedia processor core 174 through the host interface 152 and 172.

The above sequence is commonly applied to the multimedia data stored in the NAND flash memory 162 that needs to be delivered to the multimedia platform 120 for display through the display unit 135.

This, however, causes a drop in process efficiency of the main processor 110 while the main processor 110 is delivering the data to the multimedia platform 120. This can also cause a bottleneck problem while communicating the data between the host interfaces 152 and 172.

Moreover, including the three chips (i.e. main processor 110, memory chip 115 and multimedia platform 120), the portable terminal 100 has to be at least a certain size.

In other words, as the portable terminal 100 comprises more multimedia functions, more efficient integration is required.

As a result, the multi-chip package technology, in which the NAND flash memory 162 and the buffer memory 164 are combined in one chip, has been developed.

However, by preparing the multimedia platform 120 and the memory chip 115 separately, the there becomes less available space in a motherboard of the portable terminal 100, and as a result, it becomes difficult to include additional functions in a small size motherboard. This also inhibits the effort to make the portable terminal 100 smaller.

DISCLOSURE

Technical Problem

In order to solve the above problems, the present invention provides a method for sharing a nonvolatile memory and a device having a one-chip multimedia platform including a plurality of memories that can easily make a portable terminal smaller and/or add additional functions by integrating the memory chip and the multimedia platform in one chip by use of the POP (package on package) technology.

The present invention also provides a method for sharing a nonvolatile memory and a device having a multimedia platform including a plurality of memories that can minimize the bottleneck problem occurred during the communication of data between the main processor and the multimedia processor and deliver the data quickly by having the memory chip and memories in the multimedia platform shared and/or exclusively used by the main processor.

The present invention also provides a method for sharing a nonvolatile memory and a device having a multimedia platform including a plurality of memories that can have the application processor control the display unit regardless of the main processor.

The present invention also provides a method for sharing a nonvolatile memory and a device having a one-chip multimedia platform including a plurality of memories that can lower the production cost of the portable terminal by integrating the memory chip and the multimedia platform by use of the POP (package on package) technology.

The present invention also provides a method for sharing a nonvolatile memory and a device having a multimedia platform including a plurality of memories that can improve the integration rate of the motherboard owing to the reduction in the number of parts included in the portable terminal by forming the multimedia platform to include a plurality of memories in one chip and lower the mounting cost, which is determined by the number of mounted parts.

Other objects of the present invention will become apparent through the description below.

Technical Solution

To achieve the above objects, an aspect of the present invention features a one-chip multimedia platform having a plurality of memory devices and/or a digital processing apparatus (comprising a main processor, a multimedia platform and a display unit) having a multimedia platform.

The multimedia platform in accordance with an embodiment of the present invention can have a non-volatile memory, a multimedia processor setting a route in accordance with a route selection signal received from the main processor such that the main processor accesses the non-volatile memory or the display unit, a first volatile memory which is a temporary memory device of the main processor, and a second volatile memory which is a temporary memory of the multimedia processor.

The multimedia processor can perform booting by using boot data stored in the non-volatile memory in accordance with a control command received from the main processor, or can process to have an image inputted in real time from an image sensor display through the display unit.

The main processor can be booted by using boot data stored in the non-volatile memory accessed via the multimedia platform.

The multimedia platform can comprise a first NAND interface which is for allowing the main processor to access the non-volatile memory, a second NAND interface which interfaces with the non-volatile memory, a processor core which controls a route in accordance with the route selection signal and performing a process in accordance with a control command, a host interface which interfaces with the main processor and delivers the route selection signal and the control command received from the main processor to the processor core, a buffer interface which couples the processor core and the second volatile memory, and a route setting unit which is disposed in the back of the first NAND interface and the processor core. The route setting unit can set a route selected from the group consisting of a first route and a second route. The first route can be coupled to the second NAND interface in accordance with the route control, and the second route can be couple to the display unit in accordance with the route control.

The multimedia can further comprise a sensor interface, which interfaces with an image sensor. The processor core can control the route in accordance with the route selection signal such that the route setting unit is coupled to the display unit, and the processor core can output process data of an image, inputted in real time through the sensor interface, to the display unit in accordance with a preview command received through the host interface from the main processor.

The processor core can generate a compressed file corresponding to an image inputted through the sensor interface, using a predetermined compression algorithm, in accordance with an image photographing command received through the host interface from the main processor, and can control a route such that the route setting unit is coupled to the non-volatile memory, and then stores the generated compressed file in the non-volatile memory.

The processor core can control a route again such that the route setting unit is coupled to the display unit, once the storage of the compressed file is completed.

The route setting unit can set a route such that the second NAND interface and the first NAND interface are connected while the route control is not yet performed.

The main processor can deliver an output signal as the route selection signal to the multimedia processor. The output signal can be outputted by any one pin of GPIO (general purpose I/O) pins.

The main processor can renew a pre-designated register value by sending the route selection signal through a Data I/O, and the multimedia processor can verify the reception of the route selection signal based on the renewal status of the register value, which is present in the multimedia processor or the second volatile memory.

The multimedia processor can process to display data, which is read from the non-volatile memory and is processed, on the display unit.

The non-volatile memory, the multimedia processor and the first and second volatile memories can be formed in one chip.

The multimedia platform in accordance with another embodiment of the present invention can comprise a first stacking unit which mounts a multimedia processor and a first substrate, on which a pattern and a via hole are formed and the multimedia processor are mounted, a second stacking unit which stacks a plurality of memory devices and a second substrate, on which a pattern and a vial hole are formed and the plurality of memory devices are stacked, and a solder ball which allows the first substrate and the second substrate to come in contact. One of the first stacking unit and the second stacking unit can be formed on the bottom and the other of the first stacking unit and the second stacking unit can be formed on the top.

The plurality of memory devices can comprise at least one non-volatile memory and at least two volatile memories.

The plurality of memory devices can be stacked in the order of size.

To achieve the above objects, another aspect of the present invention features a method of sharing a plurality of memory devices included in a one-chip multimedia platform by a main processor and/or a recorded medium recording a program for executing the method.

According to an embodiment of the present invention, the method controls a route to share a non-volatile memory and to control a display unit. The route control can be performed in a multimedia processor. The multimedia processor and the non-volatile memory can be comprised in a multimedia platform. The method can comprise booting by reading boot data from the non-volatile memory accessed via a first route if a booting command is inputted from a main processor, controlling a route such that the first route is changed to a second route for accessing the display unit if a route selection signal is received from the main processor, and delivering an image inputted in real time from an image sensor to the display unit via the second route if a preview command is inputted from the main processor.

The above method can further comprise generating a compressed file corresponding to the image inputted from the image sensor, by using a predetermined compression algorithm, if an image photographing command is inputted from the main processor, controlling a route such that the second route is changed to the first route, storing the generated compressed file in the non-volatile memory through the first route, and controlling a route such that the first route is changed to the second route.

MODE FOR INVENTION

Figure 1:
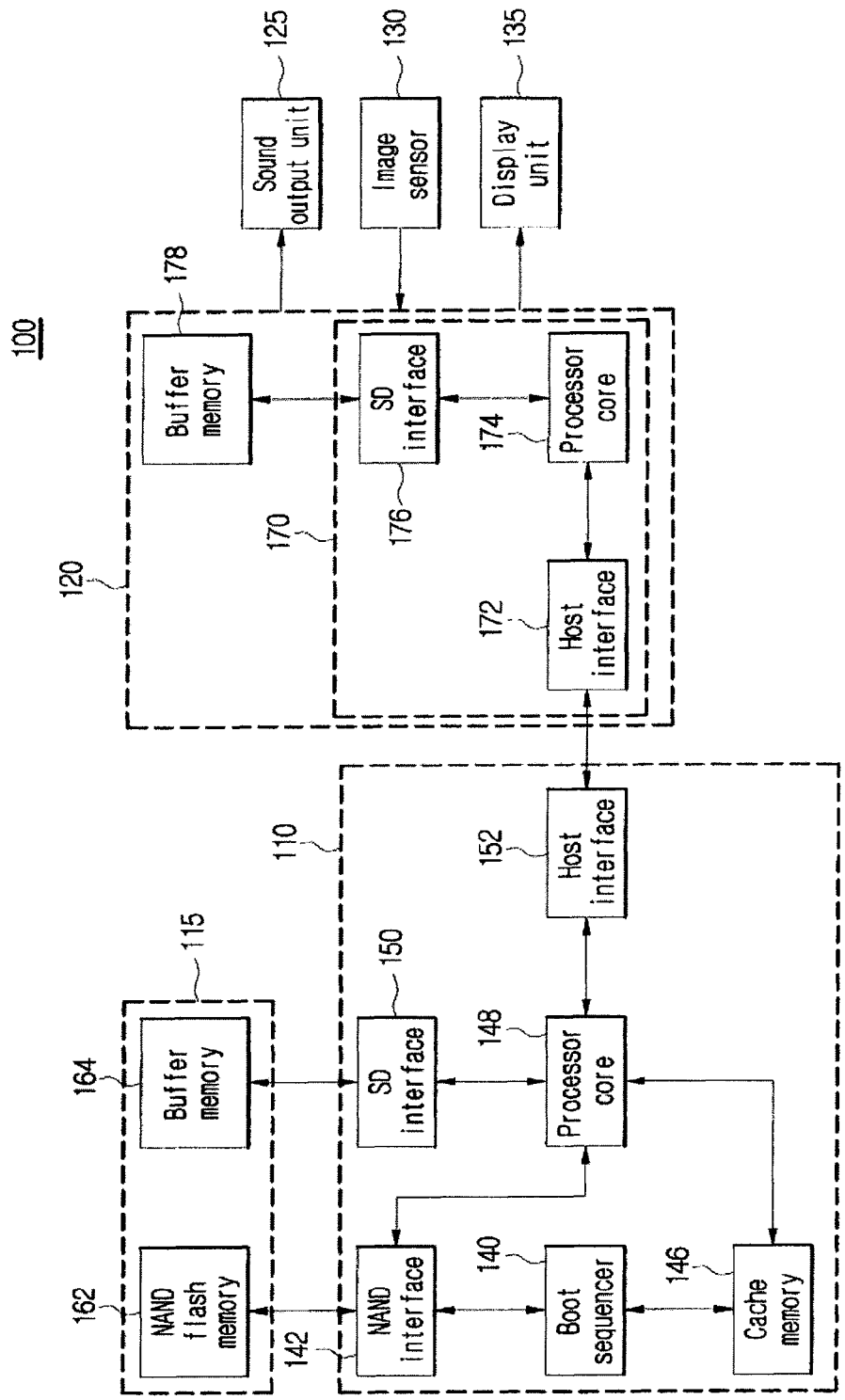
FIG. 1 shows a diagram of the connection structure between processors in accordance with the prior art.

The above objects, features and advantages will become more apparent through the below description with reference to the accompanying drawings.

Since there can be a variety of permutations and embodiments of the present invention, certain embodiments will be illustrated and described with reference to the accompanying drawings. This, however, is by no means to restrict the present invention to certain embodiments, and shall be construed as including all permutations, equivalents and substitutes covered by the spirit and scope of the present invention. Throughout the drawings, similar elements are given similar reference numerals. Throughout the description of the present invention, when describing a certain technology is determined to evade the point of the present invention, the pertinent detailed description will be omitted.

Terms such as "first" and "second" can be used in describing various elements, but the above elements shall not be restricted to the above terms. The above terms are used only to distinguish one element from the other. For instance, the first element can be named the second element, and vice versa, without departing the scope of claims of the present invention. The term "and/or" shall include the combination of a plurality of listed items or any of the plurality of listed items.

When one element is described as being "connected" or "accessed" to another element, it shall be construed as being connected or accessed to the other element directly but also as possibly having another element in between. On the other hand, if one element is described as being "directly connected" or "directly accessed" to another element, it shall be construed that there is no other element in between.

The terms used in the description are intended to describe certain embodiments only, and shall by no means restrict the present invention. Unless clearly used otherwise, expressions in the singular number include a plural meaning. In the present description, an expression such as "comprising" or "consisting of" is intended to designate a characteristic, a number, a step, an operation, an element, a part or combinations thereof, and shall not be construed to preclude any presence or possibility of one or more other characteristics, numbers, steps, operations, elements, parts or combinations thereof.

Unless otherwise defined, all terms, including technical terms and scientific terms, used herein have the same meaning as how they are generally understood by those of ordinary skill in the art to which the invention pertains. Any term that is defined in a general dictionary shall be construed to have the same meaning in the context of the relevant art, and, unless otherwise defined explicitly, shall not be interpreted to have an idealistic or excessively formalistic meaning.

Hereinafter, preferred embodiments will be described in detail with reference to the accompanying drawings. Identical or corresponding elements will be given the same reference numerals, regardless of the figure number, and any redundant description of the identical or corresponding elements will not be repeated.

Although it is evident that the method for sharing a memory in accordance with the present invention can be equivalently applied to all types of digital processing devices or systems (e.g. portable terminals and/or home digital appliances, such as the mobile communication terminal, PDA, portable multimedia player (PMP), MP3 player, digital camera, digital television, audio equipment, etc.), which have a plurality of processors and in which a particular memory needs to be shared by a plurality of processors or a plurality of elements included in a processor need to share a memory simultaneously, the portable terminal will be described hereinafter for the convenience of description and understanding. Moreover, it shall be easily understood through the below description that the present invention is not limited to a specific type of terminal but is applicable equivalently to any terminal having a plurality of processors and a memory shared by elements.

Figure 2:
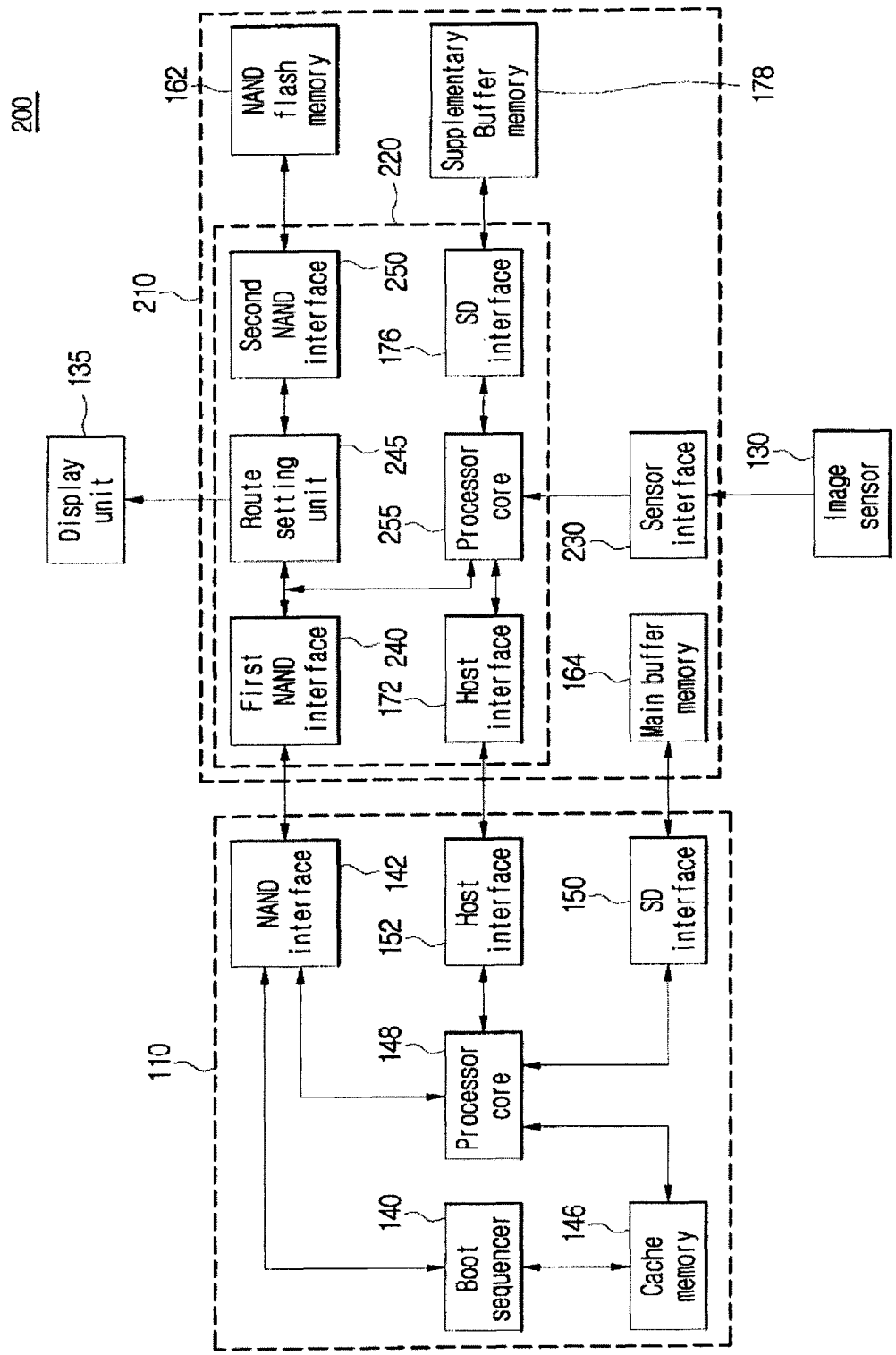
FIG. 2 shows a diagram of the connection structure between a plurality of processors in accordance with an embodiment of the present invention.

FIG. 2 is a diagram showing the connection structure between a plurality of processors in accordance with an embodiment of the present invention.

Referring to FIG. 2, a portable terminal 200 of the present invention comprises the main processor 110, a multimedia platform 210, the image sensor 130 and the display 135. It is evident that the portable terminal 200 can further comprise the sound output unit 125. The main processor 110 and multimedia platform 210 can be realized in one chip, respectively.

The main processor 110 comprises the boot sequencer 140, the NAND interface 142, the cache memory 146, the processor core 148, the SD interface 150 and the host interface 152.

The boot sequencer 140 accesses a NAND flash memory 162 through the NAND interface 142 and delivers the boot data, read by accessing a first NAND interface 240, a route setting unit 245 and a second NAND interface 250 in a multimedia processor 210, to the main processor core 148 to have the main processor core 148 perform the booting. To access the NAND flash memory 162, the boot sequencer 140 sends a first route selection signal to the route setting unit 245 through the NAND interface 142 and the first NAND interface 240. The first route selection signal instructs on the route for the boot sequencer 140 to access the NAND flash memory 162. By setting the route to have the first NAND interface 240 and the second NAND interface 250 connect by default, the route setting unit 245 can have the main processor 110 access the NAND flash memory 162 even if there is no route selection signal in the initial booting stage of the portable terminal 200.

The main processor core 148 performs a logic and/or operation pre-designated to function as the main processor 110. For example, the main processor core 148 can instruct the booting and operation of the multimedia processor 220. The main processor core 148 can comprise the cache memory 146 as a memory for performing the pre-designated logic or operation. The cache memory 146 can be, for example, an SDRAM.

The NAND interface 142 interfaces with the first NAND interface 240, included in the multimedia processor 220. The main processor 100 can access the NAND flash memory 162, using the NAND interface 142.

The SD interface 150 (or the buffer interface) interfaces with the main buffer memory 164, included in the multimedia platform 210. The main buffer memory 164 can be a buffer memory for the operation of the main processor core 148.

The host interface 152 interfaces with the host interface 172 of the multimedia platform 210 for the communication of control commands.

The multimedia platform 210 comprises the multimedia processor 220, the NAND flash memory 162, the main buffer memory 164, a supplementary buffer memory 178 and a sensor interface 230. The supplementary buffer memory 178 can be a buffer memory for the operation of the multimedia processor core 255. The multimedia platform 210 is stacked through the POP (package on package) technology in order to include the multimedia processor 220, the NAND flash memory 162, the main buffer memory 164 and the supplementary buffer memory 178. The vertical stacking structure of the multimedia platform 210 in accordance with the present invention will be described later with reference to FIG. 3.

The main and supplementary buffer memories 164 and 178 are only an example of a volatile memory, such as an SDRAM, and the NAND flash memory 162 is only an example of a nonvolatile memory. In other words, it is evident that there can be a variety of memory types that are included in the multimedia platform 210. However, in this description, the buffer memory and the NAND flash memory are described as an example of a volatile memory and a nonvolatile memory, respectively.

The multimedia processor 220 comprises the host interface 172, the SD interface 176 (or the buffer interface), the first NAND interface 240, the route setting unit 245, the second NAND interface 250 and the multimedia processor core 255.

The host interface 172 interfaces with the main processor 110 for the communication of commands for control, such as processing multimedia data, controlling the display unit and photographing. In addition, a route selection signal for setting a route can be communicated by the route setting unit 245 through the host interface 172.

The SD interface 176 interfaces with the supplementary buffer memory 178, which is for processing multimedia data of the multimedia processor 220. The main and supplementary buffer memories 164 and 178 can be, for example, an SDRAM.

One end of the first NAND interface 240 is coupled to the NAND interface 142 of the main processor 110, and the other, the route setting unit 245.

The route setting unit 245 sets a route corresponding to the route selection signal, being inputted from the main processor 110 or the multimedia processor core 255. That is, in accordance with how the route is set by the route setting unit 245, the main processor 110 or the multimedia processor core 255 can be coupled to the NAND flash memory 162 or to the display unit 135. Therefore, the route setting unit 245 can make the first NAND interface 240 or the multimedia processor core 255 couple to the second NAND interface 250 or makes the multimedia processor core 255 couple to the display unit 135, in accordance with the route selection signal. The route can be set by renewing the chip select setting information. The main processor 110 or the multimedia processor core 255 can be coupled to the NAND flash memory 162 or the display unit 135 in accordance with the route control of the route setting unit 245. Therefore, it will be necessary for the processor, which is accessed to the NAND flash memory, to notify the other processor of its access status such that the main processor 110 and the multimedia processor 220 do not try to access one NAND flash memory 162 at the same time. The operation sequence of the route setting unit 245 will be described later in detail.

The second NAND interface 250 interfaces with the NAND flash memory 162 and the multimedia processor 220. The NAND flash memory 162 is coupled to the main processor 110 or the multimedia processor core 255 according to the setting of route by the route setting unit 245.

The sensor interface 230 is interfacing means for receiving the inputted image data (or the inputted image signal) outputted from the image sensor 130.

The display unit 135 is means for displaying the operation status of the portable terminal 200 and the image data inputted from the image sensor 130 and processed by the multimedia processor 220. The display unit 135 can have a buffer memory and display the data stored in the buffer memory in a visual information format.

As described above, the multimedia platform 210 of the present invention is realized in a chip comprising a plurality of memories, reducing the number of parts included in the portable terminal 200. Therefore, the integration rate of the motherboard can be improved, and the mounting cost, which is determined by the number of mounted parts, can be lowered.

Hereinafter, the booting sequence of each processor of the portable terminal 200 will be briefly described.

The brief booting sequence of the main processor 110 is as follows:

Once the portable terminal 200 is powered on, the boot sequencer 140 accesses the NAND flash memory 162 through the NAND interface 142, via the first NAND interface 240, the route setting unit 245 and the second NAND interface 250 in the multimedia processor 220. To access the NAND flash memory 162, the boot sequencer 140 can send the first route selection signal to the route setting unit 245 through the NAND interface 142 and the first NAND interface 240. The route setting unit 245 sets a route for the boot sequencer 140 to access the NAND flash memory 162 according to the received first route selection signal. By setting the route to have the first NAND interface 240 and the second NAND interface 250 connect by default, the route setting unit 245 can have the main processor 110 access the NAND flash memory 162 even if there is no route selection signal in the initial booting stage of the portable terminal 200. In other words, the chip select status of the route setting unit 245 by default can be set to have the main processor 110 access the NAND flash memory 162.

Then, in order to have the main processor core 148 boot, the boot sequencer 140 writes the boot data, read from the NAND flash memory 162, in the cache memory 146 and then delivers the boot data, written in the cache memory 146, to the main processor core 148. Of course, it is also possible that the main processor core 148 reads the boot data written in the cache memory 146.

After the booting through the use of the delivered boot data, the main processor core 148 reads the data for operating the portable terminal 200 that are stored in the NAND flash memory 162 through the NAND interface 142, the first NAND interface 240, the route setting unit 245 and the second NAND interface 250 and stores the data in the main buffer memory 164 in the multimedia platform 210 accessed through the SD interface 150. The operating data stored in the NAND flash memory 162 is stored in the main buffer memory 164 because the operating speed of the NAND flash memory 162 is slow. It is also possible that the data for operating the portable terminal 200 are read when the boot data is read, and stored in the main buffer memory 164. Moreover, the boot data can be stored together with the main buffer memory 164 and is used during the booting. The main processor 110 can read the operating data from the NAND flash memory 162 and write the operating data in the cache memory 146 or the main buffer memory 164, and then can terminate the access to the NAND flash memory 162. Through this, the multimedia processor 200 can access the NAND flash memory 162 for booting.

Next, the booting sequence of the multimedia processor 220 is as follows:

The main processor core 148 sends a boot command to the multimedia processor core 255 through the host interface 152 and 172 for the booting of the multimedia processor core 255.

The multimedia processor core 255 accesses the NAND flash memory 162 through the route setting unit 245 and the second NAND interface 250, and reads the boot data stored in an area of the NAND flash memory 162. The multimedia processor core 255 can further read data for the operation.

The multimedia processor core 255 then stores the read boot data (and operating data) in the supplementary buffer memory 178 through the SD interface 174. The multimedia processor core 255 performs the booting by use of the boot data stored in the supplementary buffer memory 178.

The main processor 110 sends a second route selection signal, immediately before or after the booting of the multimedia processor core 255, to the multimedia processor core 255, which delivers the second route selection signal to the route setting unit 245 (or controls the route setting unit 245 in accordance with the second route selection signal). The route setting unit 245 changes the route, which was set to be connected to the NAND flash memory 162, to access the display unit 135, in accordance with the second route selection signal. The operating data, stored in the supplementary buffer memory 178, includes data for controlling the operation status of the display unit 135, and the multimedia processor core 255 becomes to function as a processor controlling the display unit 135.

The multimedia processor core 255 allows the images in a predetermined quantity, for example, 1 image, to be stored in the buffer memory included in the display unit 135, which displays the image(s) stored in the buffer memory. Thus, to change the image displayed through the display unit 135, the multimedia processor core 255 needs to update the image stored in the buffer memory within the display unit 135.

The booting sequence of the multimedia processor core 255 described above can be commonly applied to any case of reading multimedia data, which needs to be processed by the multimedia processor core 255, stored the NAND flash memory 162. In other words, if the main processor 110 sends only the process command and route control signal to the multimedia processor 220, the multimedia processor 220 can access the NAND flash memory and read and process the necessary data in accordance with the process command. The process command may comprise a process instruction and storage location information of the data to be processed.

In other words, the multimedia processor core 255 can directly access the NAND flash memory 162 and read the needed boot data without having to receive the boot data for booting or the multimedia data for processing from the main processor 110

This solves the problem of lowered process efficiency in the conventional connection structure in which a plurality of processors are connected linearly through the memory chip 115—main processor 110—multimedia platform 210 and thus the main processor 110 has to read the needed data (e.g. boot data or multimedia data) from the NAND flash memory 162 and deliver the data to the multimedia processor 220 when the multimedia processor 220 is booted or the multimedia data is processed.

Hereinafter, the process of the main processor 110 sending a route selection signal to the multimedia processor core 255 will be briefly described. By controlling the route setting unit 245 in accordance with the route selection signal, the multimedia processor core 255 allows the main processor 110 or the multimedia processor core 255 to access the NAND flash memory 162 or the display unit 135.

First, the sequence of the first or second route selection signal being delivered to the multimedia processor core 255 by the hardware structure is as follows:

The route control value corresponding to the route setting unit 245 is set to have a first value (e.g. "0"), and in this condition the route setting unit 245 sets the route such that the second NAND interface 250 is coupled. However, once a second value (e.g. "1") is received from the main processor 110 through the host interface 172, the route setting unit 245 changes the route in accordance with the control of the multimedia processor core 255 such that the display unit 135 is coupled.

Since the route control value corresponding to the route setting unit 245 is "0" when the portable terminal 200 is powered on (or when it is in the default condition), the route setting unit 245 sets the route to access the NAND flash memory 162 such that the boot sequencer 140 can access the NAND flash memory 162 via the NAND interface 142, the first NAND interface 240, the route setting unit 245 and the second NAND interface 250.

The main processor core 148, in which the booting is performed using the boot data read by the boot sequencer 140, reads the operating data from the NAND flash memory 162 and stores the operating data in the main buffer memory 164, and then terminates the access to the NAND flash memory 162.

The main processor core 148 then sends a boot command to the multimedia processor core 255 through the host interface 152 and 172, and the multimedia processor core 255 can read the boot data and the operating data by accessing the route setting unit 245 and the second NAND interface 250. The read boot data and operating data are stored in the supplementary buffer memory 178.

Then, the main processor core 148 uses a route control pin, pre-assigned among GPIO (general-purpose I/O) pins, to output the route control value of "1" as a route selection signal such that the route is reset to the multimedia processor core 255 to couple the route setting unit 245 and the display unit 135, and the route control value of "1" is delivered to the multimedia processor core 255 through the host interface 152 and 172.

The multimedia processor core 255 controls the route setting unit 245 to set a route corresponding to the route selection signal received through the host interface 172. That is, the route setting unit 245 terminates the setting of the route to the NAND flash memory 162 in accordance with the control of the multimedia processor core 255 and sets the route to access the display unit 135.

The display unit 135 displays the image provided by the multimedia processor core 255 through the set route.

Then, if the main processor 110 is desired to access the NAND flash memory 162, the main processor 110 uses the pre-assigned route control pin to output the route control value of "0" as the route selection signal, and allows the multimedia processor core 255 to control the resetting of the route of the route setting unit 245. Likewise, if the multimedia processor core 255 is desired to access the NAND flash memory 162, the multimedia processor core 255 can control the route setting unit 245 or request the main processor 110 to output the route control value of "0".

Next, the sequence of the route selection signal being delivered to the multimedia processor core 255 by the software structure is as follows:

The route control value of the route setting unit 245 is set to have a first value (e.g. "0"), and in this condition the route setting unit 245 sets the route such that the NAND flash memory 162 is coupled. However, once a second value (e.g. "1) is received from the main processor 110, the route setting unit 245 renews the route in accordance with the control of the multimedia processor core 255 such that the display unit 135 is coupled.

Since the route control value corresponding to the route setting unit 245 is "0" when the portable terminal 200 is powered on (or when it is in the default condition), the route is set to access the NAND flash memory 162, and thus the boot sequencer 140 accesses the NAND flash memory 162 through the NAND interface 142, the first NAND interface 240, the route setting unit 245 and the second NAND interface 250 and enables the booting by the main processor core 148.

After completing the booting, the main processor core 148 boots the multimedia processor core 255 by providing a booting command to the multimedia processor core 255.

Then, the main processor core 148 writes the second value (e.g. "1") in a register inside the multimedia platform 210 through the Data I/O of the host interface 152 and 172 such that the route is reset to the multimedia processor core 255 to couple the route setting unit 245 and the display unit 135. The register is in the multimedia processor core 255 or the supplementary buffer memory 178, and can be managed by the multimedia processor core 255.

The multimedia processor core 255 recognizes that the value written in the register (i.e. the register value) has been renewed and controls such that the route setting unit 245 sets a route corresponding to the register value. That is, the route setting unit 245 terminates the setting of the route to the NAND flash memory 162 and sets the route to the display unit, in accordance with the control of the multimedia processor core 255.

The display unit 135 displays the image provided by the multimedia processor core 255, through the set route.

Then, if the main processor 110 is desired to access the NAND flash memory 162, the main processor 110 has the first value written in the pre-assigned register to allow the multimedia processor core 255 to control the resetting of the route of the route setting unit 245. Likewise, if the multimedia processor core 255 is desired to access the NAND flash memory 162, the multimedia processor core 255 can control the route setting unit 245 or request the main processor 110 to write the first value.

Through the above steps, the portable terminal 200 (i.e. each processor) can complete the buffer setting for operation and the loading of necessary data.

Next, the steps of the multimedia processor 220 performing the camera function will be described. The multimedia processor 220 has two operation modes of the camera: the preview mode and the multimedia operation mode. The preview mode is for viewing the image before photographing, and the multimedia operation mode is for performing the photographing operation in accordance with the input of image photographing command.

The preview mode gets started by a preview command, received from the main processor 110 through the host interface 152 and 172. The multimedia processor core 255 processes in real time an image, inputted from the image sensor 130 (e.g. a CMOS image sensor and a CCD sensor) through the sensor interface 230, and stores the processed image in the buffer memory of the display unit 130 through the route setting unit 245. The display unit 135 sequentially displays the images stored in the buffer memory in real time.

The multimedia processor 220 can adjust the size, give image effects (e.g. color value adjustment, black-and-white effect and sketch effect) and process for the on-screen display such that the inputted image can be displayed through the display unit 135. The result processed by the multimedia processor 220 can be temporarily stored in the supplementary buffer memory 178 before being provided to the display unit 135.

The multimedia operation mode gets started by an image photographing command, received from the main processor 100 through the host interface 152 and 172. The multimedia processor core 255 converts the image, inputted from the image sensor 130 through the sensor interface 230, to a compressed file by use of a predetermined compression algorithm (e.g. the MPEG4 compression algorithm) and temporarily stores the file in the supplementary buffer memory 178.

To store the compressed file, stored in the supplementary buffer memory 178, in the NAND flash memory 162, the multimedia processor core 255 controls the route setting unit 245 to set a route for accessing the NAND flash memory 162. Once the compressed file is completely stored in the NAND flash memory 162, the route setting unit 245 resets the route for accessing the display unit 135 (i.e. reset to the default state).

In this case, it is necessary to store an image corresponding to the compressed file in the buffer memory of the display unit 135 such that the user can determine whether to delete or keep the compressed file, generated by the image photographing command. The image can be written in the buffer memory of the display unit 135 before resetting the route for accessing the NAND flash memory 162 or can be written in the buffer memory of the display unit 162 by controlling the resetting of the route of the route setting unit 245 after the multimedia processor core 255 stores the compressed file in the NAND flash memory 162. Since the display unit 135 displays the data written lastly in the buffer memory, the displayed image can be different depending on whether there is an image corresponding to the compressed file. Of course, it is evident that a black screen can be only displayed on the display unit 135 along with the photographing sound (e.g. "click") during the multimedia operation mode.

Figure 3:
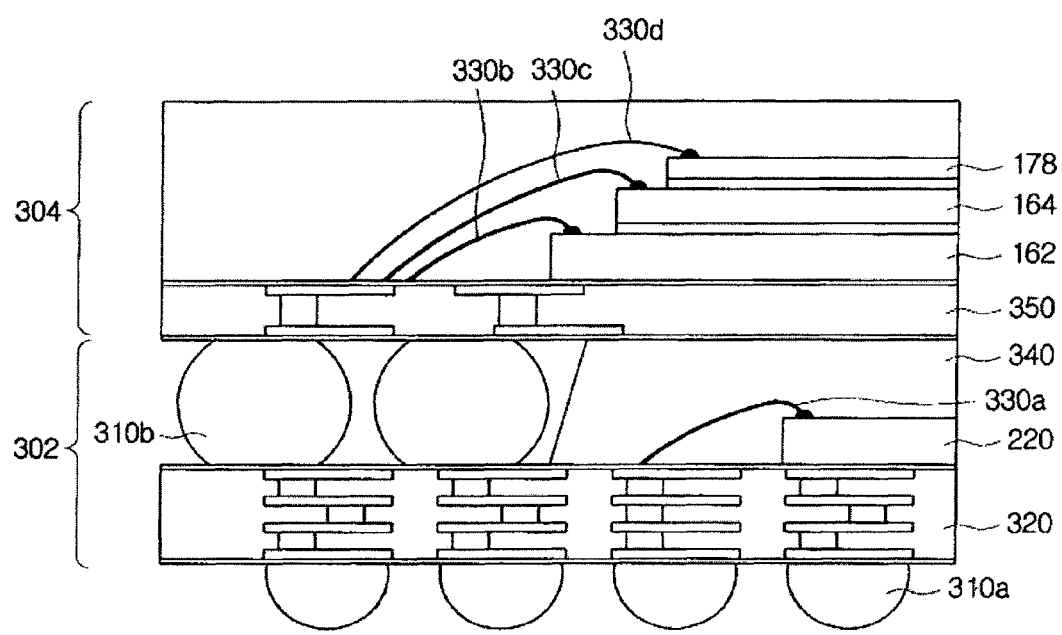
FIG. 3 shows the stacking structure of a multimedia platform in accordance with an embodiment of the present invention.

FIG. 3 is a diagram showing the stacking structure of a multimedia platform in accordance with an embodiment of the present invention.

As shown in FIG. 3, the POP (package on package) technology can be utilized to generate the multimedia platform 210, on which the multimedia processor 220, the NAND flash memory 162, the main buffer memory 164 and the supplementary buffer memory 178 are stacked in a single chip.

In the vertical structure of the multimedia platform 210, first solder balls 310a are formed on the bottom of the structure, to mount the multimedia platform on the motherboard of the portable terminal 200.

Formed on top of the first solder balls 310a is a first substrate 320, in which a design pattern and via holes are formed. Mounted on top of the first substrate 320 is the multimedia processor 220, which is connected to the first substrate 320 through a wire bond 330a. An electrical mold compound (EMC) 340 is formed around the multimedia processor 220 in order to prevent electrical conduction.

Second solder balls 310b are formed on top of the first substrate 320 to make contact with a second substrate 350. The second solder balls 310b may be substituted by conductive balls.

Like the first substrate 320, a design pattern and via holes are formed on the second substrate 350. On the upper side of the second substrate 350, a plurality of memory devices are stacked in accordance with their sizes. The memory devices can comprise the NAND flash memory 162, the main buffer memory 164 and the supplementary buffer memory 178, and if necessary, other memory devices can be additionally stacked. The memory devices are stacked in a manner that smaller memory devices are placed over larger memory devices, and are connected to the second substrate 350 by the wire bond 330b, 330c and 330d.

In the stacking structure of the multimedia platform 210 shown in FIG. 3, a second stacking unit 304, in which the second substrate 350 and a plurality of memory devices are stacked, is stacked on top of a first stacking unit 302, in which the first substrate 320 and the multimedia processor 220 are stacked.

As necessary, however, it should be evident that the second stacking unit 302 can be placed under the first stacking unit 304 in the multimedia platform 210. As described above, the first substrate 320 and the second substrate 350 can be in contact with each other by the second solder balls 310b, regardless of their placement.

The drawings and detailed description are only examples of the present invention, serve only for describing the present invention and by no means limit or restrict the spirit and scope of the present invention. Thus, any person of ordinary skill in the art shall understand that a large number of permutations and other equivalent embodiments are possible. The true scope of the present invention must be defined only by the spirit of the appended claims.

[Industrial Applicability]

As described above, the present invention can easily make a portable terminal smaller and/or add additional functions by integrating the memory chip and the multimedia platform in one chip by use of the POP (package on package) technology.

The present invention can minimize the bottleneck problem occurred during the communication of data between the main processor and the multimedia processor and deliver the data quickly by having the memory chip and memories in the multimedia platform shared or exclusively used by the main processor.

With the present invention, the application processor can control the display unit regardless of the main processor.

The present invention can also lower the production cost of the portable terminal by integrating the memory chip and the multimedia platform in one chip by use of the POP (package on package) technology.

Moreover, the present invention can improve the integration rate of the motherboard owing to the reduction in the number of parts included in the portable terminal by forming the multimedia platform to include a plurality of memories in one chip and lower the mounting cost, which is determined by the number of mounted parts.

The invention claimed is:

1. A multimedia platform comprising:
a first stacking unit including a first substrate and a multimedia processor, wherein a pattern and a via hole are formed on the first substrate, and the multimedia processor is mounted on top of the first substrate;
a second stacking unit including a second substrate and a plurality of storage devices, wherein a pattern and a via hole being formed on the second substrate, and the plurality of storage devices are mounted on top of the second substrate; and
at least one solder ball arranged on the first stacking unit, the at least one solder ball allowing the first substrate to be coupled to the second substrate,
wherein the multimedia processor includes:
    a processor core configured to control a route in accordance with a route selection signal and to perform a process in accordance with a first control command from an external main processor, and
    a route setting unit coupled to the processor core and coupled between the external main processor and at least one of the plurality of storage devices, the route setting unit being configured to set the route selected between a first route and a second route, the first route being coupled to the at least one of the plurality of storage devices in accordance with a first route control based on the route selection signal, and the second route being coupled to an external display unit in accordance with a second route control based on the route selection signal.

2. The multimedia platform of claim 1, wherein the plurality of storage devices comprise at least one non-volatile storage device and at least two volatile storage devices.

3. The multimedia platform of claim 1, wherein the plurality of storage devices are stacked in the order of size.

4. The multimedia platform of claim 1, wherein the multimedia processor includes the processor core configured to control the route in accordance with the route selection signal, so that the first route to access at least one of the plurality of storage devices is changed to the second route to access the external display unit in response to the route control signal received from the external main processor.

* * * * *